United States Patent
Abadeer et al.

(10) Patent No.: US 7,471,114 B2
(45) Date of Patent: Dec. 30, 2008

(54) DESIGN STRUCTURE FOR A CURRENT CONTROL MECHANISM FOR POWER NETWORKS AND DYNAMIC LOGIC KEEPER CIRCUITS

(75) Inventors: Wagdi W. Abadeer, Jericho, VT (US); George M. Braceras, Essex Junction, VT (US); Albert M. Chu, Essex Junction, VT (US); John A. Fifield, Underhill, VT (US); Harold Pilo, Underhill, VT (US); Daryl M. Seitzer, Essex Junction, VT (US)

(73) Assignee: International Buisness Machines Corporation, Armonk, NY (US)

( * ) Notice: Subject to any disclaimer, the term of this patent is extended or adjusted under 35 U.S.C. 154(b) by 0 days.

(21) Appl. No.: 11/851,133

(22) Filed: Sep. 6, 2007

(65) Prior Publication Data

US 2008/0169839 A1  Jul. 17, 2008

Related U.S. Application Data

(63) Continuation-in-part of application No. 11/623,112, filed on Jan. 15, 2007.

(51) Int. Cl.
H03K 19/096 (2006.01)
(52) U.S. Cl. .................. 326/95; 326/83; 326/112; 326/98; 716/12
(58) Field of Classification Search ........... 326/93–98, 326/82, 83, 86, 87, 112, 119
See application file for complete search history.

(56) References Cited

U.S. PATENT DOCUMENTS

| | | | |
|---|---|---|---|
| 6,002,292 A * | 12/1999 | Allen et al. | 327/379 |
| 6,549,040 B1 | 4/2003 | Alvandpour et al. | |
| 2003/0030474 A1* | 2/2003 | McGowan | 327/202 |
| 2004/0041590 A1* | 3/2004 | Bernstein et al. | 326/95 |
| 2004/0104744 A1* | 6/2004 | Bosshart | 326/95 |
| 2004/0263209 A1* | 12/2004 | Choe | 326/98 |
| 2006/0214695 A1* | 9/2006 | Lih et al. | 326/98 |
| 2006/0290385 A1* | 12/2006 | Belluomini et al. | 326/97 |

OTHER PUBLICATIONS

Kim, C.H., et al., "A Process Variation Compensating Technique for Sub-90 nm Dynamic Circuits", VLSI Circuits 2003, Digest of Technical Papers, 2003 Symposium on Jun. 12-14, 2003, pp. 205-206.
Kursun, E.G. et al., "Domino Logic With Dynamic Body Biased Keeper", Solid-State Circuits Conference 2002, ESSCIRC 2002, Sep. 24-26, 2002, pp. 675-678.

* cited by examiner

Primary Examiner—Vibol Tan
Assistant Examiner—Jany Tran
(74) Attorney, Agent, or Firm—W. Riyon Harding; Greenblum & Bernstein P.L.C.

(57) ABSTRACT

A design structure for an integrated circuit that includes a gate control voltage generator that supplies a current control gate voltage to a plurality of current control devices of a corresponding plurality of dynamic logic circuits each having a keeper circuit. The gate control voltage generator provides, via current control gate voltage, global control of the amount of keeper current flowing through the keeper circuits so as to enhance the performance of the dynamic logic circuits.

17 Claims, 8 Drawing Sheets

DESIGN STRUCTURE FOR A CURRENT CONTROL MECHANISM FOR POWER NETWORKS AND DYNAMIC LOGIC KEEPER CIRCUITS

CROSS REFERENCE TO RELATED APPLICATION

This application is a continuation in part of pending U.S. patent application Ser. No. 11/623,112, filed Jan. 15, 2007, titled, "CURRENT CONTROL MECHANISM FOR DYNAMIC LOGIC KEEPER CIRCUITS IN AN INTEGRATED CIRCUIT AND METHOD OF REGULATING SAME" and incorporated herein by reference in its entirety. This application is assigned to the present assignee.

FIELD OF THE DISCLOSURE

The present disclosure generally relates to the field of keeper circuits for dynamic logic gates. In particular, the present disclosure is directed to a design structure for a current control mechanism for dynamic logic keeper circuits in an integrated circuit and method of regulating same.

BACKGROUND

In certain applications, it is advantageous to use dynamic logic circuits because they are faster than static logic circuits. Dynamic logic circuits require an internal node to be pre-charged to a voltage, e.g., precharged to the circuit's power supply voltage, such as to Vdd. However, in their simplest form, there is no active circuitry to hold this charge on the internal node, rather the charge is held via a capacitive charge only.

Although, dynamic logic circuits are fast, a drawback of dynamic logic circuits is that they are prone to current leakage. Consequently, a practical dynamic logic gate must use a "keeper" device that is connected to the precharged node in order to prevent diffusion leakage, source-drain leakage, gate leakage and noise from inadvertently discharging the precharged node. Any node that is not actively held at a desired state tends to drift, e.g., to Vdd, Vdd/2, or ground. If the node of a dynamic logic circuit drifts away from the precharged level, the state of the logic gate may spuriously change without input stimuli. The keeper device is a dynamic device through which enough current flows to ensure that a certain amount of leakage current does not discharge the node, while at the same time not swamping the node, so that the impact to switching speed is minimized. Additionally, it is desirable for the keeper device to have just enough strength to keep the node from discharging, while not being overly large so as to slow down, or interfere with normal switching.

In early semiconductor technologies, the keeper device provided a relatively small amount of current to compensate for leakage and was not large enough to significantly alter the speed of the dynamic logic gate. However, with advances in semiconductor technology, device geometries are decreasing. Consequently, the gate dielectrics have thinned below the tunneling range of approximately 17 angstrom and, thus, the off-state leakage of the combinatorial logic of a dynamic logic gate becomes significantly larger. As a result, there is less distinction between the off- and on-states of dynamic logic gates and, thus, there is increased sensitivity to leakage that may result in the dynamic logic gates not functioning properly. The leakage has become sufficiently large in leading-edge technology to require larger keeper devices in order to compensate for worst-case leakage. Consequently, when it comes time to discharge the node during normal operation, at which time the keeper circuit is also discharged, the nominal circuit performance of dynamic logic gates may be degraded by approximately 30%, mitigating some of dynamic logic's advantage over static logic.

For these reasons, a need exists for a current control mechanism for dynamic logic keeper circuits in an integrated circuit that will provide performance improvements of dynamic logic gates fabricated using leading-edge technologies.

SUMMARY OF THE DISCLOSURE

In one embodiment, the present disclosure is directed to a design structure of an integrated circuit comprising a power network and a dynamic logic keeper circuit. The dynamic logic keeper circuit includes a logic evaluation node rail having a rail voltage. A pre-charge device is electrically coupled between the power network and the logic evaluation node rail and responsive to a clock signal. A keeper device is electrically coupled to the logic evaluation node rail. A current source device is electrically coupled between the power network and the keeper device and is responsive to a gate control voltage signal generated as a function of the rail voltage.

In another embodiment, the present disclosure is directed to a design structure of an integrated circuit comprising a power network and a plurality of dynamic logic circuits each including a first logic evaluation node rail and a pre-charge device electrically coupled between the power network and the logic evaluation node rail and being responsive to a clock signal. Each of the plurality of dynamic logic circuits also includes a first keeper device electrically coupled to the logic evaluation node rail and a first current source device electrically coupled between the power network and the keeper device and responsive to a gate control voltage signal. A gate control voltage generator is in electrical communication with the first current source device of each of the plurality of dynamic logic circuits. The gate control voltage generator generates the gate control voltage signal.

In a further embodiment, the present disclosure is directed to a design structure for regulating a keeper current of at least one dynamic logic circuit. The method comprises providing a keeper device and providing a power network. A current control device is coupled between the power network and the keeper device. A gate control voltage signal is generated as a function of a logic evaluation node rail voltage and a reference voltage. The current control device is controlled using the gate control voltage signal so as to regulate the keeper current.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

In one embodiment, the present disclosure includes a design structure for a current control mechanism for dynamic logic keeper circuits in an integrated circuit that provides performance improvements of dynamic logic gates that may be fabricated in today's leading-edge technologies. More particularly, each dynamic logic gate may include a current-control device coupled between a power network and a keeper device so as to regulate the amount of current passing through the keeper device, whereby the keeper strength is optimized based on leakage, temperature, and power supply voltage. More specifically, in this embodiment the integrated circuit includes at least one gate control voltage generator that supplies a current-control gate voltage to each of the current-control devices. The current-control gate voltage is a constant gate drive level used as a global control for determining the amount of keeper-current flowing through a plurality of dynamic logic gates.

Figure 1:
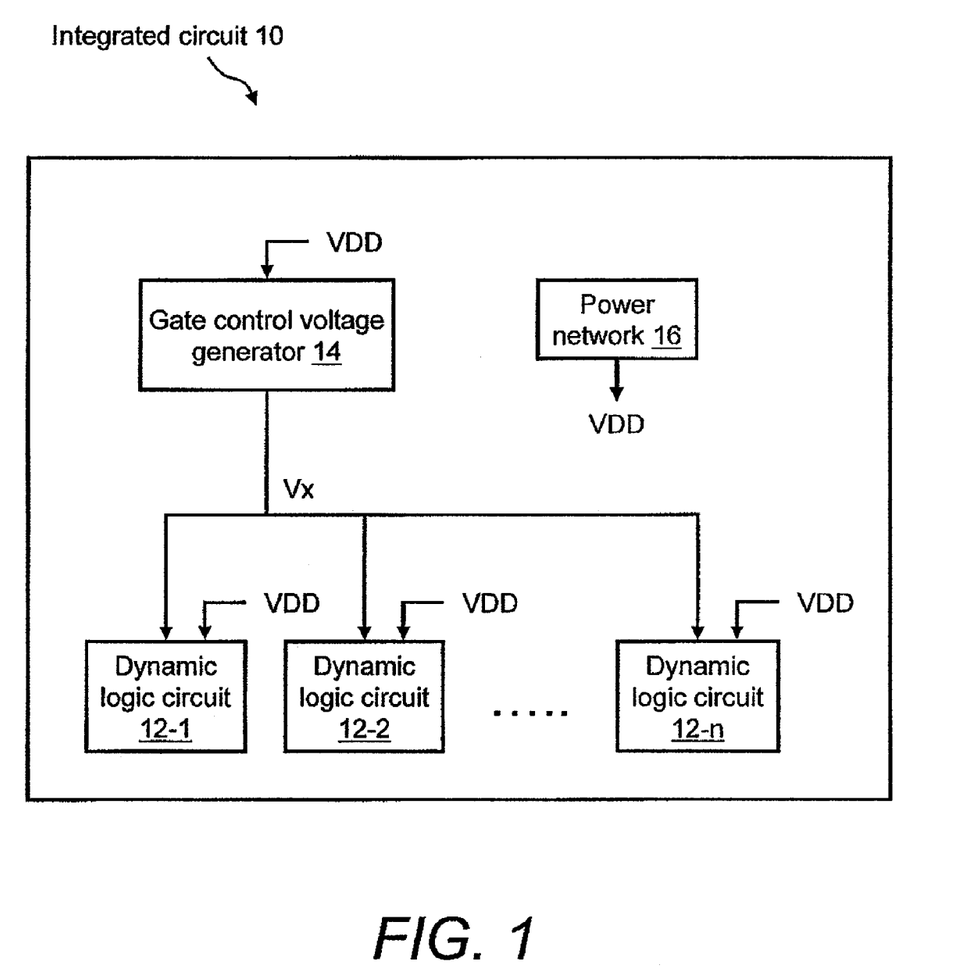
FIG. 1 illustrates a functional block diagram of an integrated circuit that includes a current control mechanism for dynamic logic keeper circuits.

FIG. 1 illustrates a functional block diagram of an integrated circuit 10. Integrated circuit 10 includes one or more dynamic logic circuits 12 (e.g., dynamic logic circuits 12-1, 12-2, through 12-n), which may be dynamic logic gates that include a current-controlled keeper circuit (not shown). More details of an exemplary dynamic logic circuit 12 are described below with reference to FIG. 2. Additionally, integrated circuit 10 includes a gate control voltage generator 14, which may be a leakage monitor and gate control generator circuit that supplies an output voltage Vx (i.e., the gate-control voltage) that feeds each current-controlled keeper circuit of the one or more dynamic logic circuits 12. More details of an exemplary gate control voltage generator 14 are described below with reference to FIG. 3. Additionally, integrated circuit 10 includes a power network 16, which may be the power distribution network for supplying an operating voltage (e.g., Vdd (VDD) or any multiple thereof) to, among other things, dynamic logic circuits 12 and gate control voltage generator 14. A voltage source (not shown) of power network 16 may be, for example, an internal or external direct current (DC) power supply. Example VDD values may include, but are not limited to, 1.0, 1.2, and 3.3 volts.

A single current control device (see, e.g., "I-source device 28" in FIG. 2) within each dynamic logic circuit 12 of integrated circuit 10 is utilized under the control of gate-control voltage Vx, which is supplied by gate control voltage generator 14. In particular, the value of gate-control voltage Vx regulates dynamically the amount of current passing through the keeper device (see, e.g., element 26 in FIG. 2) of a dynamic logic keeper circuit within each dynamic logic circuit 12 in such a way that the keeper strength is optimized. In doing so, performance improvements are achieved within each dynamic logic circuit 12, as an amount of current that is sufficient to prevent the node from drifting under present operating conditions is supplied by the keeper device therein. More details of the operation of dynamic logic circuits 12 in combination with gate control voltage generator 14 are described below with reference to FIGS. 2 through 7.

Figure 2:
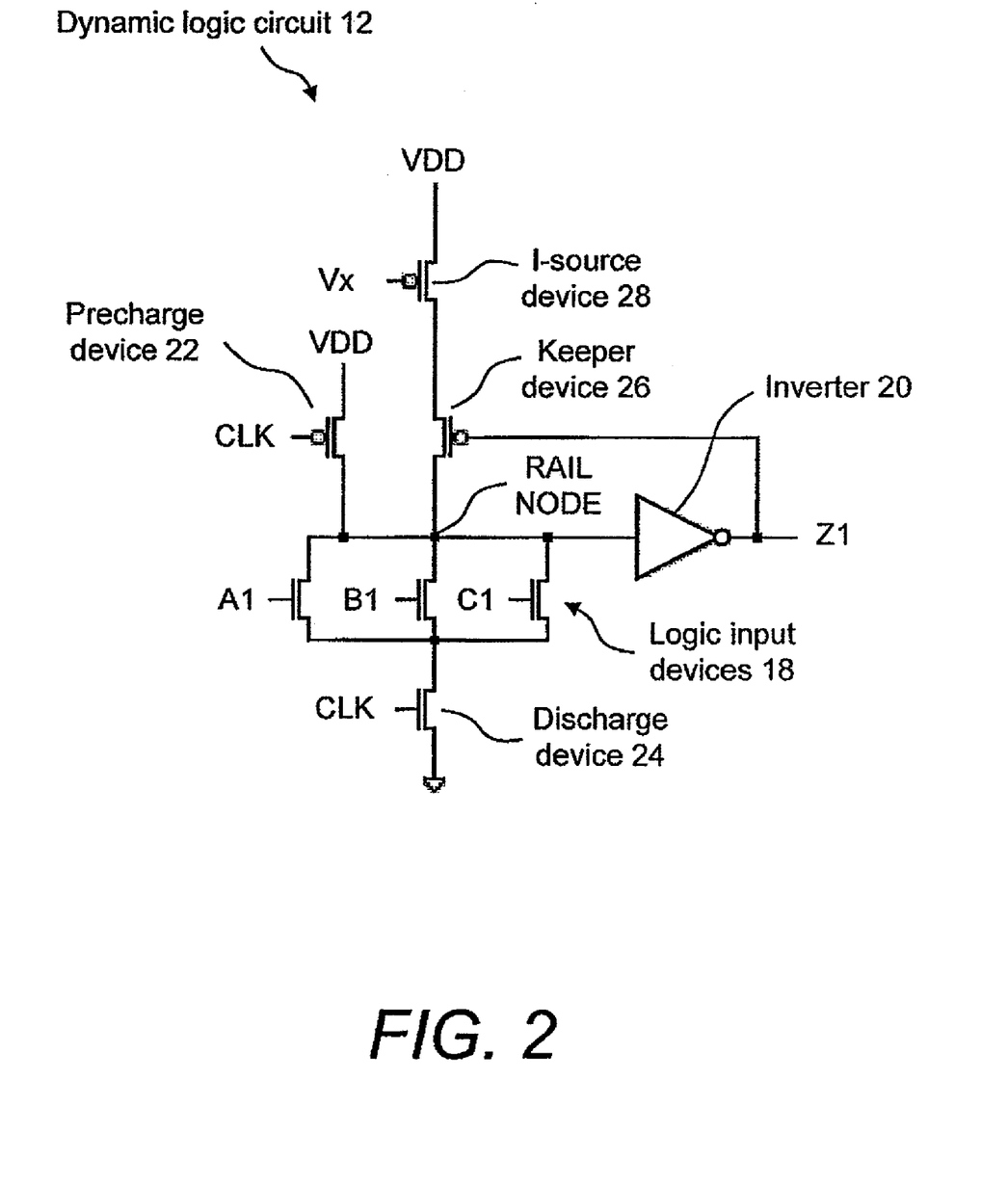
FIG. 2 illustrates a schematic diagram of an example dynamic logic circuit that includes a current control device for dynamic logic keeper circuits of the integrated circuit of FIG. 1.

Referring to FIG. 2, and also to FIG. 1, FIG. 2 illustrates a schematic diagram of an example dynamic logic circuit 12 that, depending on the logic needed, could be any one or more of dynamic logic circuits 12-1 to 12-n of FIG. 1. Dynamic logic circuit 12 includes a keeper device 26 and current control device 28 coupled between a power network and the keeper device for regulating the flow of current to the keeper device. Those skilled in the art will readily appreciate that dynamic logic circuit 12 may be any combination of n-type and/or p-type transistors, such as positive field-effect transistors (PFETs) and/or negative field-effect transistors (NFETs), that form any logic gate of any functional circuit within an integrated circuit, such as within integrated circuit 10 of FIG. 1. Common types of logic gates include, but are not limited to, AND, NAND, OR, NOR, X-OR, X-NOR, buffer, and inverter gates.

By way of example, however, dynamic logic circuit 12 is shown as being a 3-input OR gate that includes a set 18 of logic input devices in the form of NFETs A1, B1, and C1 whose drains are electrically connected to an input of an inverter 20, which is a voltage node heretofore referred to as RAIL NODE. Additionally, a discharge device 24, which in this example is an NFET, is electrically connected between the sources of NFETs A1, B1, and C1 and ground. Additionally, a precharge device 22, which in this example is a PFET, is electrically connected between RAIL NODE and VDD. The gates of precharge device 22 and discharge device 24 are both connected to a clock input (CLK). Those skilled in the art will recognize that the arrangement of NFETs A1, B1, and C1, inverter 20, precharge device 22, and discharge device 24, as shown in FIG. 2, are the basic electronic switch elements that form a common 3-input OR gate.

During the precharge phase, the gates of NFETs A1, B1, and C1 are typically low and CLK is low; therefore, NFETs A1, B1, and C1 and discharge device 24 are open and no discharge path from RAIL NODE to ground exists. Therefore, because CLK is low, precharge device 22 is conductive and, thus, RAIL NODE is precharged to the level of VDD, and the output Z1 of inverter 20 is low. After completing the precharge phase, CLK goes high and, thus, precharge device 22 is shut off and discharge device 24 is made conductive. Subsequently, in the event that any one of NFETs A1, B1, or C1 are set to high, a discharge path is completed between RAIL NODE and ground and, thus, RAIL NODE transitions from its precharged VDD level to ground and the output Z1 of inverter 20 transitions from low to high, and so on as is well known in the operation of a dynamic logic OR gate.

Figure 3:
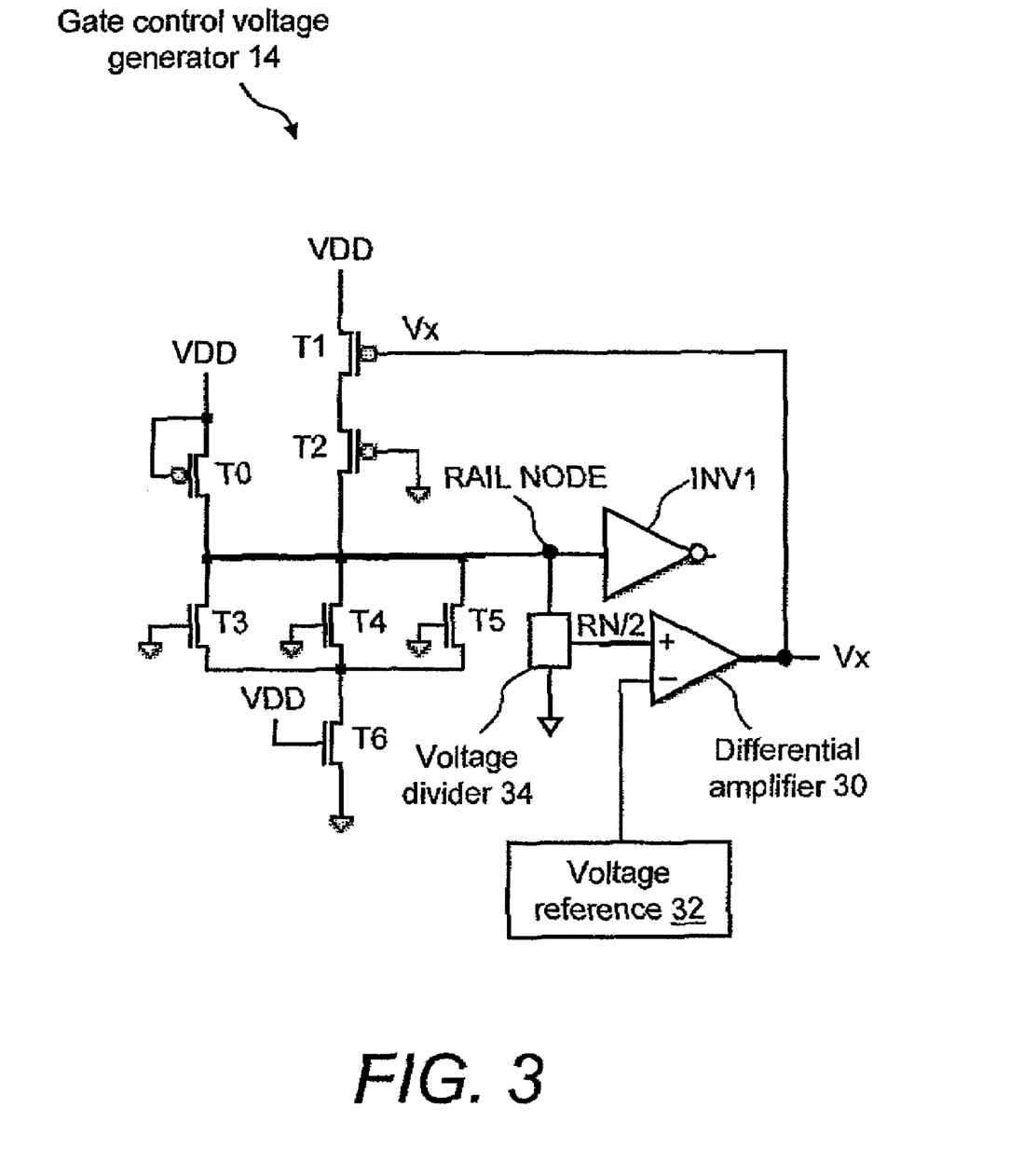
FIG. 3 illustrates a schematic diagram of an example gate control voltage generator, which may be a leakage monitor and gate control generator circuit of the integrated circuit of FIG. 1.

To compensate for leakage current that may cause the voltage at RAIL NODE to drift away from its precharged level, dynamic logic circuit 12 includes keeper device 26 and current control device 28, which in this example may be PFETs, connected in series between RAIL NODE and VDD, as shown in FIG. 2. An output Z1 of inverter 20 may be electrically connected to the gate of keeper device 26. Furthermore, the gate-control voltage Vx output of gate control voltage generator 14 (FIG. 1), which, again, is described below in connection with FIG. 3, is electrically connected to the gate of current control device 28. The width and length of current control device 28, which is the current supply device, is adjusted as a function of the height and width of the logic gate. In this way, a large logic gate has a proportionally larger keeper current in order to account for its larger leakage.

The operation of keeper device 26 is first described as if current control device 28 is not present in the circuit as follows. Because RAIL NODE is precharged to, for example, VDD, which is a logic high, the output Z1 of inverter 20 is low. Because output Z1 is low and connected to the gate of keeper device 26, keeper device 26, which is a traditional keeper PFET in this example, turns on and supplies current to RAIL NODE and, therefore, holds or "keeps" RAIL NODE at the precharged level. In doing so, RAIL NODE is not left to float. Because keeper device 26 is sized to handle worst-case leakage conditions, without current control device 28 in the keeper circuit, the amount of keeper current supplied to RAIL NODE by keeper device 26 exceeds the current minimally required to maintain RAIL NODE at nominal operating conditions and interferes with normal switching speeds.

However and with continuing reference to FIG. 2, the presence of current control device 28 in series with keeper device 26 between VDD and RAIL NODE serves as a current-limiting device and, thus, does not allow keeper device 26 to supply keeper current at its maximum design capability. More specifically, the gate of current control device 28 is controlled by Vx of gate control voltage generator 14 of integrated circuit 10 which varies dynamically based on, for example, leakage, temperature, and power supply voltage. Additionally, because the width and length of current control device 28 is adjusted as a function of the height and width of the logic gate, the keeper circuit that is formed by the current-source device connected in series with keeper device 26 has just enough strength to keep the node from discharging under the present operating conditions, and no more. As a result, the interference of the keeper circuit with normal switching operations of RAIL NODE is minimized and, thus, the switching performance of the dynamic logic circuit 12 is optimized.

Referring now to FIG. 3, and also to FIGS. 1 and 2, FIG. 3 illustrates a schematic diagram of exemplary circuitry for gate control voltage generator 14, which provides a leakage monitor and gate voltage control generator circuit for dynamic logic circuits 12-1 to 12-n. When each dynamic logic circuit 12-1 to 12-n has keeper circuitry configured like dynamic logic circuit 12 (FIG. 2), gate control voltage generator 14 supplies gate-control voltage Vx to current control device 28 of FIG. 2 in order to maintain the logic evaluation node, RAIL NODE, at a predetermined and precharged level in the presence of leakage.

Gate control voltage generator 14 may be formed of a certain arrangement of components that mimic in form and function any dynamic logic gate (e.g., 3-input OR gate) as well as the novel keeper circuit of dynamic logic circuit 12 of FIG. 2 (e.g., current control device 28 arranged between keeper device 26 and VDD) in combination with the output (i.e., gate-control voltage Vx) of a controlled differential amplifier output 30. By way of example: an inverter INV1 of gate control voltage generator 14 mimics inverter 20 of dynamic logic circuit 12; NFET T0 of gate control voltage generator 14 mimics precharge device 22 of dynamic logic circuit 12; an arrangement of PFETs T1 and T2 of gate control voltage generator 14 mimics current control device 28 and keeper device 26, respectively, of dynamic logic circuit 12; and an arrangement of NFETs T3, T4, and T5 of gate control voltage generator 14 mimics NFETs A1, B1, and C1, respectively, of dynamic logic circuit 12. NFET T6 of gate control voltage generator 14 mimics discharge device 24 of dynamic logic circuit 12.

Transistor T0, which is the precharge device, is set to a non-conductive state and, thus, there is no precharge path between VDD and RAIL NODE of gate control voltage generator 14. Transistor T6, which is the discharge device, is set to a conductive state, but transistors T3, T4, and T5 are set to an open state and, thus, there is no discharge path between RAIL NODE and ground. Transistor T2, which is the keeper device, is set to a conductive state and, thus, keeper current is being supplied continuously to RAIL NODE of gate control voltage generator 14. RAIL NODE may be the logic evaluation node rail of gate control voltage generator 14. Differential amplifier 30, which may be a standard operational amplifier, dynamically senses the voltage on RAIL NODE and regulates RAIL NODE via transistor T1, which is the keeper current control device. The width and length of transistor T1 may be adjusted as a function of the height and width of the logic gate as described above in connection with FIG. 2. In this way, a large logic gate has a proportionally larger keeper current in order to account for its larger leakage.

More specifically, the output Vx of differential amplifier 30 is regulating RAIL NODE to a desired level as follows. RAIL NODE voltage is divided, e.g., in half by a voltage divider 34 that provides a voltage output RN/2 that is supplied to the positive input of differential amplifier 30. Voltage divider 34 may be a low current voltage divider circuit. In one example, voltage divider 34 may be formed of a pair of ultra-low current tunneling-oxide devices that are described below with reference to FIG. 4. In another example, voltage divider 34 may be formed of a pair of very large resistors.

A voltage reference 32 that is formed of a resistor divider or any other stable voltage source is set to a value that is slightly below VDD/2. Voltage reference 32 may be a fixed voltage generator or a variable (e.g., programmable) voltage generator. In one example, if VDD equals 1.2 volts, voltage reference 32 may be set to VDD/2 minus a predetermined voltage-offset. In this example, if the voltage-offset equals 0.05 volts, the reference level of voltage reference 32 equals 0.6 volts minus 0.05 volts, i.e., 0.55 volts. If differential amplifier 30 is powered by the same VDD level that operates the dynamic logic gates, it is necessary to reduce the input voltages to differential amplifier 30 in order for it to function near the center of its common mode range. A voltage Vx is generated by this negative feedback circuit that gates the specific amount of current through the current source T1 that then offsets circuit leakages to maintain RAIL NODE at a predetermined level. This predetermined level may be defined as VDD−(2×V_offset) where V_offset is the voltage offset. With VDD=1.2 volts and V-offset equal to 0.05 volts, RAIL NODE is maintained at 1.2 volts−(2×0.05 volts), i.e., 1.1 volts. In this example, the gate control voltage Vx output level of differential amplifier 30 generates 0.20 volts to 0.30 volts of overdrive to allow for good device tracking and to be essentially insensitive to threshold-voltage mismatch.

Additionally, as operating conditions vary because of leakage current, temperature, and power supply voltage varying slightly over time, the level of gate control voltage Vx of differential amplifier 30 tracks with these variations. Consequently, the keeper circuit (generally, transistor T1 in series with transistor T2) is optimized automatically based on leakage, temperature, and power supply voltage to ensure that the resulting keeper strength is just enough to keep RAIL NODE from discharging under present conditions, and no more. In other words, the self-adjusting keeper current allows the dynamic logic gate to switch at its maximum speed, because discharge of the RAIL NODE is not hindered by an unnecessary amount of keeper current.

Figure 4:
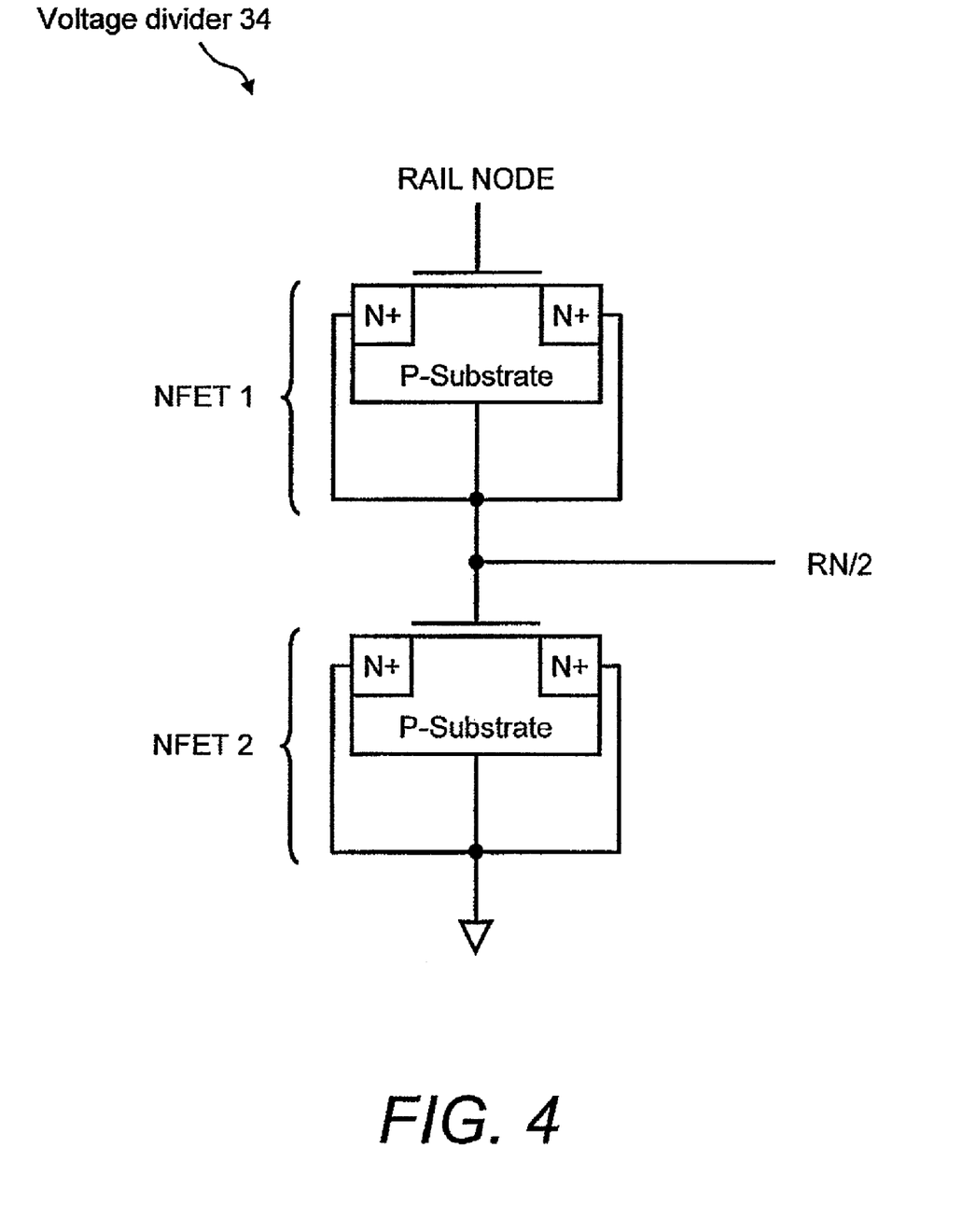
FIG. 4 illustrates a schematic diagram of a voltage divider of the gate control voltage generator of FIG. 3.

FIG. 4 illustrates a schematic diagram of exemplary circuitry for voltage divider 34 of gate control voltage generator 14 of FIG. 3. Voltage divider 34 may be formed of a pair of ultra-low current tunneling-oxide devices (e.g., ultra-low current ranging, for example, between 100 and 200 nanoamps), such as the pair of thin-gate-oxide transistors NFET1, NFET2 coupled in series as shown in FIG. 4 to take advantage of the current-tunneling phenomenon across the thin gate oxide layers (not shown) of these transistors. More details of such ultra-low current tunneling capacitive structures suitable for use in voltage divider 34 are described in U.S. Pat. No. 7,061, 308, issued Jun. 13, 2006, and titled, "Voltage divider for integrated circuits," which is incorporated by reference herein in its entirety with respect to configurations suitable for use in voltage divider 34. As those skilled in the art will readily appreciate, other devices, e.g., resistors, may be used in lieu of tunneling transistors NFET1, NFET2 to provide voltage divider 34 its voltage dividing function. Of course, one or both of nFETs NFET1, NFET2 shown may be replaced by a corresponding pFET, or by any structure having a first and second conductive material separated by a sufficiently thin insulating material, such as a metal-oxide-metal capacitor with a gate oxide less than about 1.7 nm.

Figure 5:
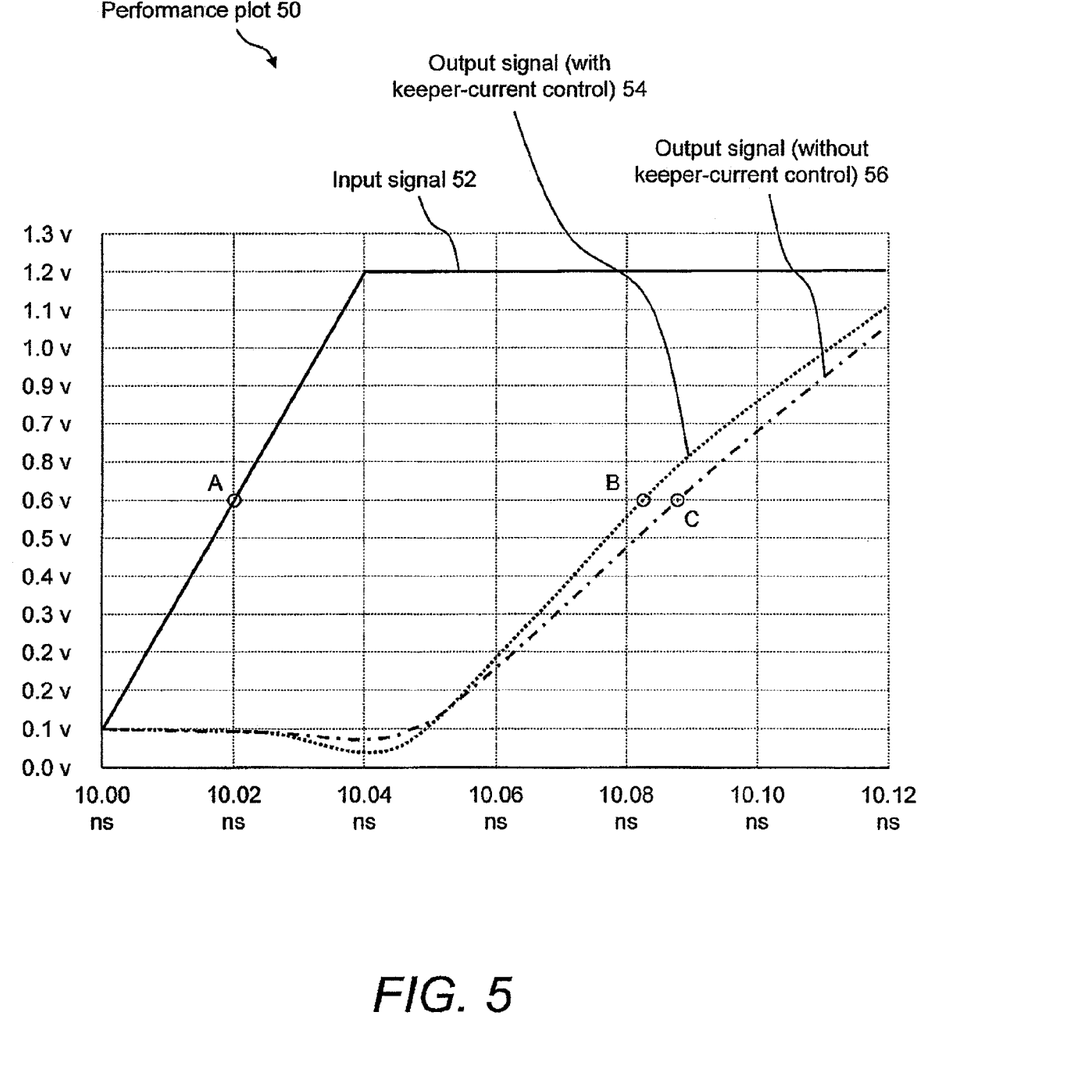
FIG. 5 illustrates a performance plot of the dynamic logic circuit of FIG. 2, which shows the performance improvement of the use of a current control mechanism for dynamic logic keeper circuits.

FIG. 5 illustrates a performance plot 50 of dynamic logic circuit 12 of FIG. 2 that shows the performance improvement of the use of a current control mechanism for dynamic logic keeper circuits. More specifically, performance plot 50 is a voltage vs. time plot of a dynamic logic gate input signal 52 and the resulting output signals 54, 56 for, respectively, a dynamic logic circuit having a current control mechanism of the present disclosure, e.g., any one of dynamic logic circuits 12-1 to 12-n of FIG. 1, and a dynamic logic circuit without the current control mechanism of the present disclosure. In particular, input signal 52 is an example clock input signal of dynamic logic circuit 12. In this example, signal 52 transitions from 0.1 volts to 1.2 volts in approximately 40 picoseconds (ps). Additionally, a VDD/2-point A, which in this example is the 0.6 volt level, is identified along the rising edge of input signal 52. Output signal 54 represents the gate propagation delay in response to input signal 52 of a dynamic logic circuit that has keeper-current control, e.g., that has current control device 28, which is controlled via gate control voltage Vx, in series with keeper device 26. A VDD/2-point B is identified along the rising edge of output signal 54. Output signal 56, on the other hand, represents the gate propagation delay in response to input signal 52 of a standard dynamic logic circuit that does not have keeper-current control, e.g., that has keeper device 26 only. A VDD/2-point C is identified along the rising edge of output signal 56.

Performance plot 50 of FIG. 5 shows how the performance of a typical dynamic logic gate (represented by signal 54) of the present disclosure that has keeper-current control is increased by about 8% over a gate without keeper-current control (represented by signal 56). This is determined by observing the time difference between points A and B, which is compared with the time difference between points A and C.

Figure 6:
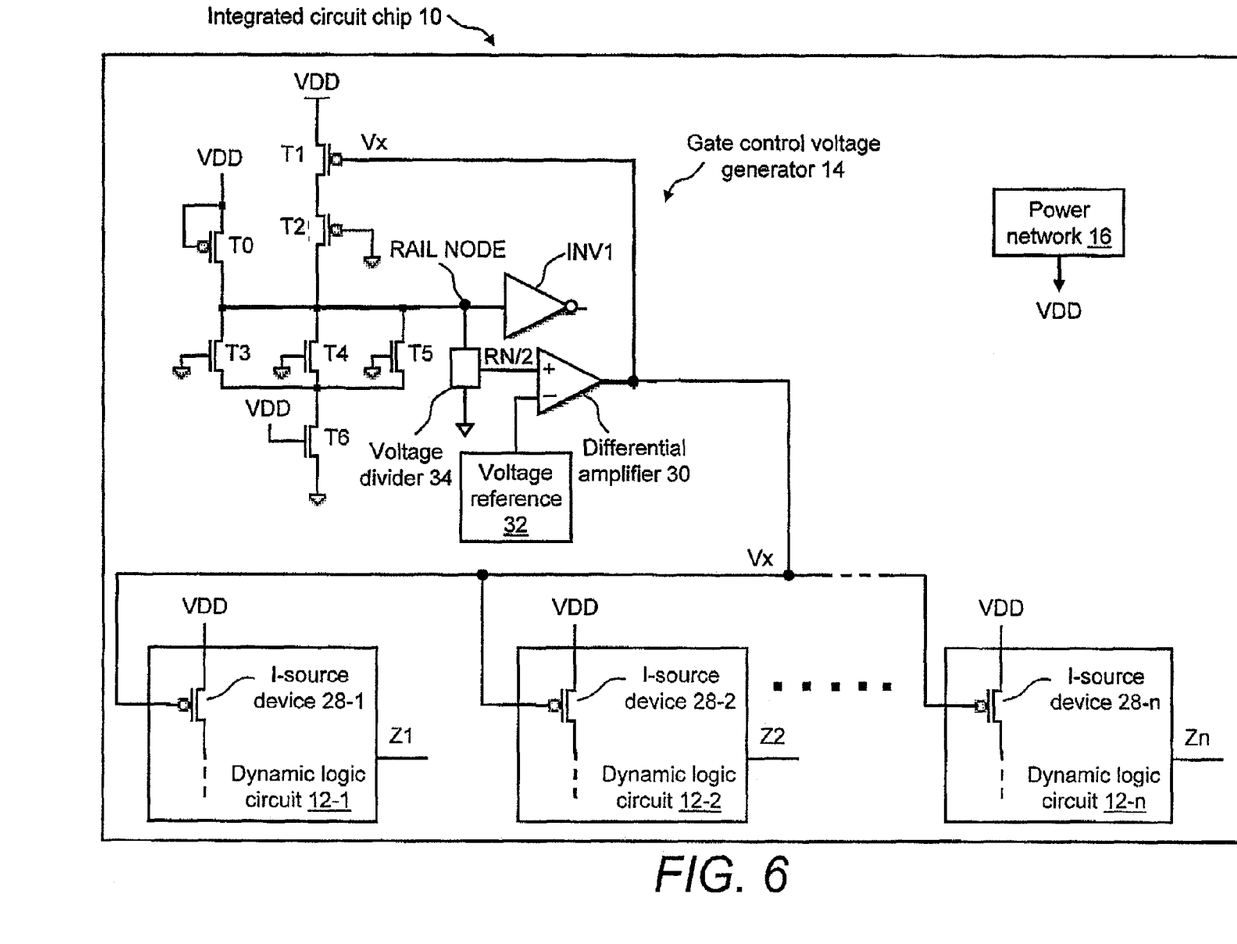
FIG. 6 illustrates a schematic diagram of the integrated circuit of FIG. 1 that includes a current control mechanism for a plurality dynamic logic keeper circuits.

FIG. 6 illustrates a schematic diagram of integrated circuit 10 that includes a current control mechanism for a plurality of dynamic logic keeper circuits. More specifically, FIG. 6 shows further details of how gate control voltage Vx output by gate control voltage generator 14 is provided to a plurality of dynamic logic circuits 12, in particular, dynamic logic circuits 12-1 through 12-n, respectively. In doing so, FIG. 6 shows how gate control voltage Vx, which is a DC voltage gate drive level, is used as a global control for determining the amount of keeper-current flowing through a plurality of dynamic logic gates. The current supply devices, e.g., transistors T1 and current control devices 28, have their width and length adjusted as a function of the length and width of their respective logic gates. In this way, a large logic gate has a proportionally larger keeper current in order to account for its larger leakage. Some over prediction may be necessary in order to compensate for line width variations across chip and to account for defect related leakage, which cannot be predicted by gate control voltage generator 14. A single gate control voltage generator circuit, i.e., gate control voltage generator 14, may be used to control a large number of logic gates, e.g., dynamic logic circuits 12-1 through 12-n. In manufacturing environments that have large across chip linewidth variation, several Vx generators may be needed in order to control accurately the keeper currents over a large chip area or to predict leakage of different circuit topologies.

In summary and with continuing reference to FIGS. 1 through 6, integrated circuit 10 that includes at least one gate control voltage generator 14 and at least one dynamic logic circuit 12 illustrates how a single leakage monitor and Vx gate control generator circuit (e.g., a single gate control voltage generator 14) may be used to limit the keeper current in a plurality of logic gates. By use of gate control voltage generator 14 in combination with dynamic logic circuits 12, the keeper current is limited to a value that is sufficient to maintain RAIL NODE at a predetermined level, and to regulate the keeper current in order to prevent a current over-supply which degrades the performance of the dynamic logic gate. A trade off between leakage immunity and device performance is made by adjustment of V_offset. V_offset may be adjusted by fuse programming or by other on-chip or off-chip mechanisms. Alternatively, the target voltage or reference voltage (voltage reference 32) that feeds the negative input of differential amplifier 30 is proportional to the trip point of, for example, an inverter device, as shown in FIG. 7.

Figure 7:
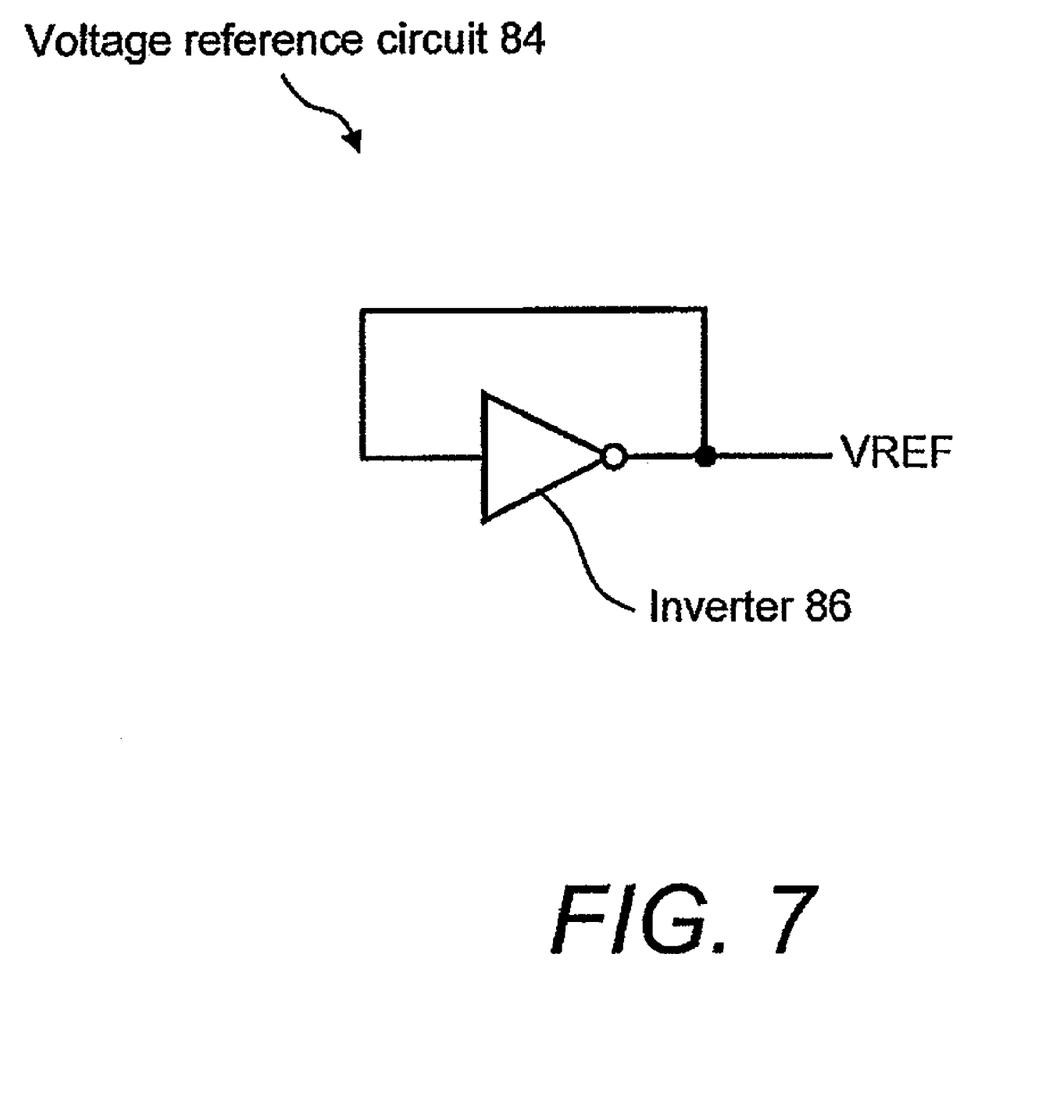
FIG. 7 illustrates a schematic diagram of an alternative voltage reference for use in the gate control voltage generator of FIG. 3.

FIG. 7 illustrates a schematic diagram of a voltage reference circuit 84 for generating voltage reference 32 of gate control voltage generator 14 of FIG. 3. FIG. 7 shows an inverter 86, whose input is electrically shorted to its output. The output of inverter 86 is a reference voltage VREF that may feed the negative input of differential amplifier 30 (FIG. 3) of gate control voltage generator 14. In this scenario, VREF is proportional to the trip point of inverter 86. In other embodiments, voltage reference 32 of FIGS. 3 and 6 may be generated by another type of voltage reference circuit. In embodiments, the logic output inverter comprising electrical elements of a first size, said reference voltage generator including a reference inverter comprising electrical elements of a second size substantially similar to said first size.

Figure 8:
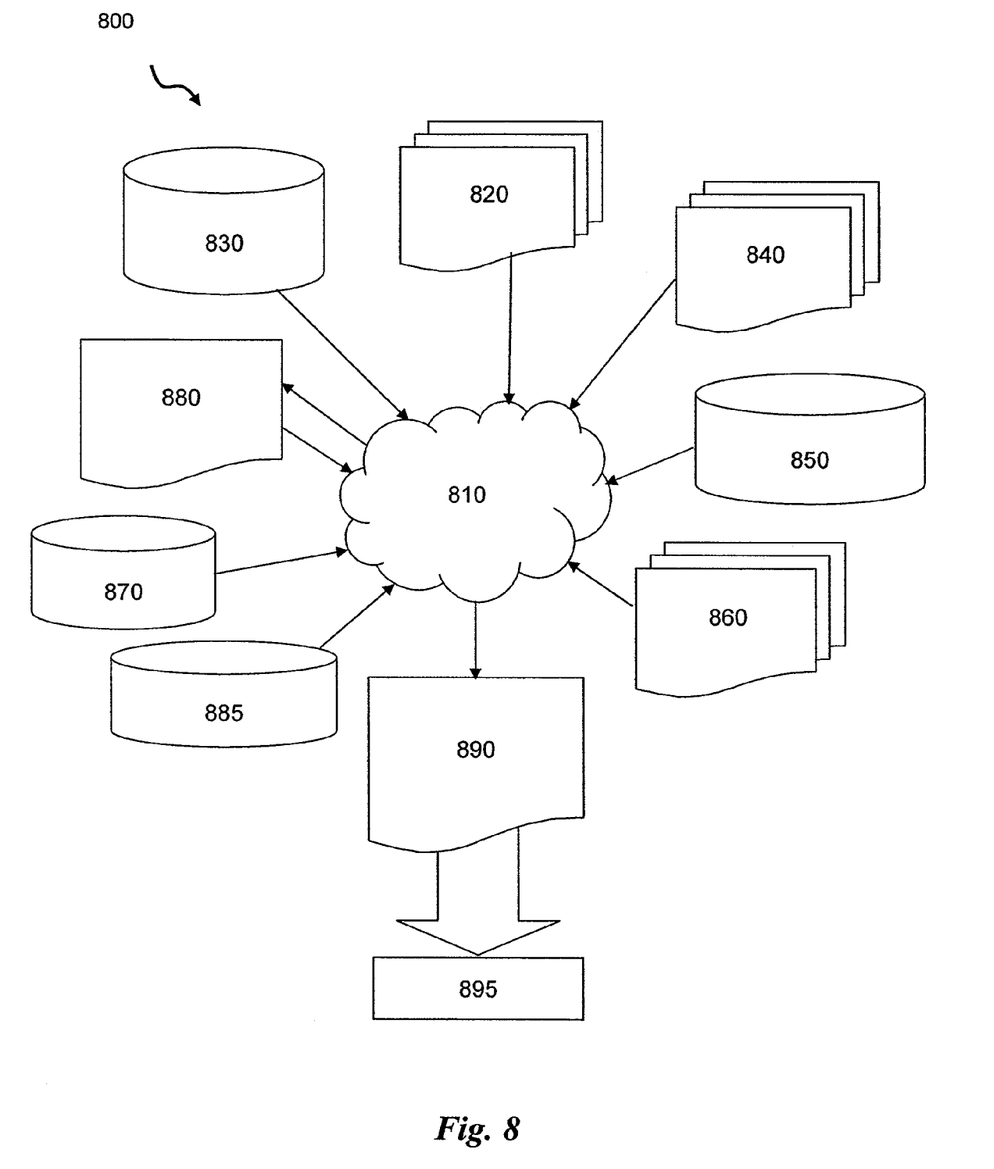
FIG. 8 illustrates a block diagram of an example design process flow.

FIG. 8 shows a block diagram of an example design flow 800. Design flow 800 may vary depending on the type of IC being designed. For example, a design flow 800 for building an application specific IC (ASIC) may differ from a design flow 800 for designing a standard component. Design structure 820 is preferably an input to a design process 810 and may come from an IP provider, a core developer, or other design company or may be generated by the operator of the design flow, or from other sources. Design structure 820 comprises integrated circuit 10 in the form of schematics or HDL, a hardware-description language (e.g., Verilog, VHDL, C, etc.). Design structure 820 may be contained on one or more machine readable medium. For example, design structure 820 may be a text file or a graphical representation of integrated circuit 10. Design process 810 preferably synthesizes (or translates) integrated circuit 10 into a netlist 880, where netlist 880 is, for example, a list of wires, transistors, logic gates, control circuits, I/O, models, etc. that describes the connections to other elements and circuits in an integrated circuit design and recorded on at least one of machine readable medium. This may be an iterative process in which netlist 880 is resynthesized one or more times depending on design specifications and parameters for the circuit.

Design process 810 may include using a variety of inputs; for example, inputs from library elements 830 which may house a set of commonly used elements, circuits, and devices, including models, layouts, and symbolic representations, for a given manufacturing technology (e.g., different technology nodes, 32 nm, 45 nm, 90 nm, etc.), design specifications 840, characterization data 850, verification data 860, design rules 870, and test data files 885 (which may include test patterns and other testing information). Design process 810 may further include, for example, standard circuit design processes such as timing analysis, verification, design rule checking, place and route operations, etc. One of ordinary skill in the art of integrated circuit design can appreciate the extent of possible electronic design automation tools and applications used in design process 810 without deviating from the scope and spirit of the invention. The design structure of the invention is not limited to any specific design flow.

Ultimately, design process 810 preferably translates integrated circuit 10, along with the rest of the integrated circuit design (if applicable), into a final design structure 890 (e.g., information stored in a GDS storage medium). Final design structure 890 may comprise information such as, for example, test data files, design content files, manufacturing data, layout parameters, wires, levels of metal, vias, shapes, test data, data for routing through the manufacturing line, and any other data required by a semiconductor manufacturer to produce integrated circuit 10. Final design structure 890 may then proceed to a stage 895 where, for example, final design structure 890: proceeds to tape-out, is released to manufacturing, is sent to another design house or is sent back to the customer.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A design structure stored in a machine readable medium, comprising:
    a power network; and
    a dynamic logic circuit that comprises;
        a logic evaluation node rail having a rail voltage;
        a pre-charge device electrically coupled between said power network and said logic evaluation node rail and responsive to a clock signal;
        a keeper device electrically coupled to said logic evaluation node rail;
        a current source device electrically coupled between said power network and said keeper device and responsive to a gate control voltage signal generated as a function of said rail voltage;
        a reference voltage generator for generating a reference voltage, said gate control signal being generated as a function of said rail voltage and said reference voltage; and
        a differential amplifier for generating said gate control signal, said differential amplifier operatively connected to each of said logic evaluation node rail and said reference generator so as to operate as a function of said rail voltage and said reference voltage.

2. The design structure of claim 1, further comprising a voltage divider that includes a first electrical element and a second electrical element coupled in series with said first electrical element so as to define an internal node, said first electrical element electrically connected to said logic evaluation node rail and said internal node electrically connected to said differential amplifier.

3. The design structure of claim 2, wherein each of said first electrical element and said second electrical element comprises a resistor.

4. The design structure of claim 2, wherein each of said first electrical element and said second electrical element comprises a capacitive structure having a tunneling current.

5. The design structure of claim 4, wherein said capacitive structure comprises a transistor having a gate oxide and said tunneling current is provided by current tunneling across said gate oxide.

6. The design structure of claim 1, wherein said reference voltage generator comprises a variable voltage generator.

7. The design structure of claim 1, further including a logic output inverter comprising electrical elements of a first size, said reference voltage generator including a reference inverter comprising electrical elements of a second size substantially similar to said first size.

8. The design structure of claim 1, wherein the design structure comprises a netlist which describes the integrated circuit.

9. The design structure of claim 1, wherein the design structure resides on a GDS storage medium.

10. The design structure of claim 1, wherein the design structure includes at least one of test data files, characterization data, verification data, or design specifications.

11. A design structure stored in a machine readable medium, comprising:
    a power network;
    a plurality of dynamic logic circuits each including:
    a first logic evaluation node rail;
    a pre-charge device electrically coupled between said power network and said logic evaluation node rail and responsive to a clock signal;
    a first keeper device electrically coupled to said logic evaluation node rail; and
    a first current source device electrically coupled between said power network and said keeper device and responsive to a gate control voltage signal; and
    a gate control voltage generator in electrical communication with said first current source device of each of said plurality of dynamic logic circuits, said gate control voltage generator generating said gate control voltage signal, wherein
    said gate control voltage generator includes
        a second logic evaluation node rail having a rail voltage;
        a second keeper device electrically coupled to said logic evaluation node rail;
        a second current source device electrically coupled between said power network and said keeper device and responsive to said gate control voltage signal;
        a reference voltage generator for generating a reference voltage; and
        a differential amplifier for generating said gate control voltage signal as a function of said rail voltage and said reference voltage.

12. The design structure of claim 11, wherein said gate control voltage generator further includes a voltage divider comprising a first electrical element and a second electrical element coupled in series with said first electrical element so as to define an internal node, said first electrical element electrically connected to said second logic evaluation node rail and said internal node electrically connected to said differential amplifier.

13. The design structure of claim 12, wherein each of said first electrical element and said second electrical element comprises a resistor.

14. The design structure of claim 12, wherein each of said first electrical element and said second electrical element comprises a leaky capacitive structure having a tunneling current.

15. The design structure of claim 14, wherein capacitive structure comprises a transistor having a gate oxide and said tunneling current is provided by current tunneling across said gate oxide.

16. The design structure of claim 11, wherein said reference voltage generator comprises a variable voltage generator.

17. The design structure of claim 11, wherein said gate control voltage generator further includes a logic output inverter comprising electrical elements of a first size, said reference voltage generator including a reference inverter comprising electrical elements of a second size substantially similar to said first size.

* * * * *